(12) United States Patent
Yasuda

(10) Patent No.: US 9,275,709 B2
(45) Date of Patent: Mar. 1, 2016

(54) ELECTRONIC APPARATUS

(71) Applicant: CANON KABUSHIKI KAISHA, Tokyo (JP)

(72) Inventor: Takayuki Yasuda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/534,458

(22) Filed: Nov. 6, 2014

(65) Prior Publication Data

US 2015/0138878 A1    May 21, 2015

(30) Foreign Application Priority Data

Nov. 21, 2013  (JP) .................................. 2013-241266

(51) Int. Cl.
| | | |
|---|---|---|
| *G11C 11/00* | (2006.01) | |
| *G11C 8/12* | (2006.01) | |
| *G11C 11/16* | (2006.01) | |
| *G11C 7/10* | (2006.01) | |

(52) U.S. Cl.
CPC .............. *G11C 8/12* (2013.01); *G11C 11/1657* (2013.01); *G11C 11/1659* (2013.01); *G11C 7/1048* (2013.01); *G11C 11/165* (2013.01)

(58) Field of Classification Search
CPC ...... G11C 8/12; G11C 7/1048; G11C 11/165; G11C 11/1657; G11C 11/1659
USPC ........ 365/148, 158, 163, 185.11, 189.17, 191
See application file for complete search history.

(56) References Cited

U.S. PATENT DOCUMENTS

| | | | | |
|---|---|---|---|---|
| 5,581,503 A | * | 12/1996 | Matsubara et al. ..... | G06F 9/445 257/E21.683 |
| 6,078,520 A | * | 6/2000 | Tobita et al. ......... | G06F 11/1433 365/185.09 |
| 7,596,041 B2 | * | 9/2009 | Shiota et al. .......... | G06F 13/385 365/189.04 |

FOREIGN PATENT DOCUMENTS

JP          2004-334626 A       11/2004

* cited by examiner

*Primary Examiner* — Tan T. Nguyen
(74) *Attorney, Agent, or Firm* — Cowan, Liebowitz & Latman, P.C.

(57) ABSTRACT

This invention makes is possible to protect programs and shorten the activation time of an electronic apparatus even if a non-volatile memory such as an MRAM stores the programs including a boot program, and is used as a main memory. Upon power-on or receiving a reset signal, a program stored in bank 102 of the non-volatile memory is transferred to another bank. Upon completion of the transfer operation, to disable access from the outside of the non-volatile memory to the bank 102 to protect the bank 102, the bank is set in a disconnection state in the non-volatile memory. A signal indicating completion of the program transfer operation is output to the outside, and a reset-release signal to a processor is generated using the signal as a trigger.

8 Claims, 11 Drawing Sheets

FIG. 3

|  | BANK102 | BANK103 | BANK104 | BANK105 | BANK106 |
|---|---|---|---|---|---|
|  | PROGRAM STORAGE REGION | | PROGRAM EXECUTION REGION AND WORK REGION | | |
| PAGE 1 | BOOT PROGRAM | BOOT PROGRAM | PROGRAM 1 | | |
| PAGE 2 | PROGRAM 1 | PROGRAM 2 | | | |
| PAGE 3 | PROGRAM 2 | | | | |
| PAGE 4 | — | | | | |

F I G. 10
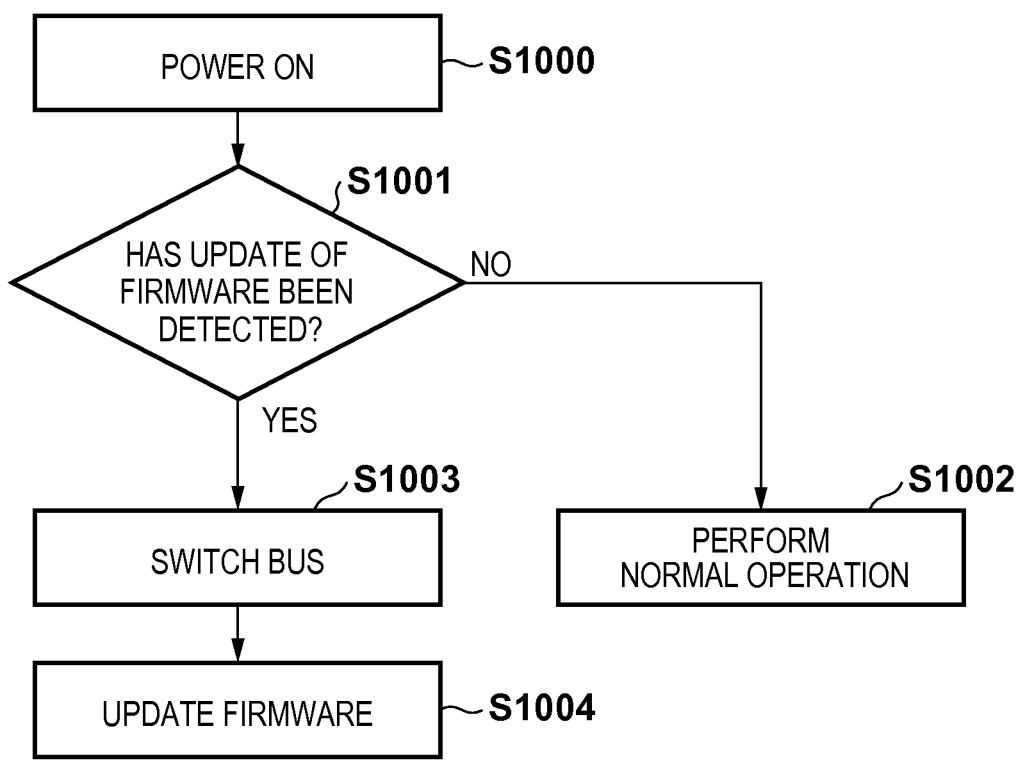

FIG. 11

|  | BANK802 | BANK103 | BANK104 | BANK105 | BANK106 |
|---|---|---|---|---|---|
|  | PROGRAM STORAGE REGION | PROGRAM EXECUTION REGION AND WORK REGION | | | |
| PAGE 1 | BOOT PROGRAM | BOOT PROGRAM | | | |
| PAGE 2 | FIRMWARE UPDATE CONTROL PROGRAM | PROGRAM 2 | FIRMWARE UPDATE CONTROL PROGRAM | | |
| PAGE 3 | PROGRAM 2 | | | | |
| PAGE 4 | — | | | | |

ELECTRONIC APPARATUS

BACKGROUND OF THE INVENTION

1. Field of the Invention

The present invention relates to an electronic apparatus and, more particularly, to a technique of protecting programs and shortening the activation time when a non-volatile memory is used as a main memory.

2. Description of the Related Art

Conventionally, in an electronic apparatus such as a digital camera, a volatile memory such as a DRAM is used as a main memory for image processing and the like. There is also proposed an arrangement in which a non-volatile memory is used as a main memory, instead of a volatile memory (for example, Japanese Patent Laid-Open No. 2004-334626).

In an electronic apparatus, there is known a method of executing a program by storing a program code and data in a non-volatile memory such as a NOR flash memory, copying the program code and data from the non-volatile memory to a volatile memory such as a DRAM whose access speed is higher before executing the program, and accessing the volatile memory.

Furthermore, in recent years, non-volatile memories, with access speeds and rewrite counts as high as the DRAM, such as MRAMs (Magnetoresistive Random Access Memory) have made their debut. This allows a single device to store a program code and provide a work region.

In an electronic apparatus including a NOR flash memory and DRAM, however, it takes time to copy a program code and data due to a problem associated with the access speed of the NOR flash memory.

A non-volatile main memory such as an MRAM can readily perform a write operation via the memory controller of the electronic apparatus, as compared with the NOR flash memory. If, therefore, the non-volatile main memory such as an MRAM stores program codes in advance, programs including a boot program may be corrupted when, for example, a program goes out of control.

SUMMARY OF THE INVENTION

The present invention provides a technique of protecting programs and shortening the activation time of an electronic apparatus in which a rewritable non-volatile memory such as an MRAM stores the programs including a boot program, and is also used as a main memory.

According to an aspect of this disclosure, there is provided an electronic apparatus comprising: a CPU configured to execute a program; a non-volatile memory storing in advance the program to be executed by the CPU and used as a main memory region for the CPU; and a reset unit configured to control reset of the CPU, and output, when the electronic apparatus enters a predetermined state, a predetermined signal to the non-volatile memory, wherein the non-volatile memory includes a plurality of memory regions including a first memory region storing the program in advance and a second memory region accessed by the CPU to execute the program, a transfer unit configured to transfer the program from the first memory region to the second memory region in response to the predetermined signal from the reset unit, and a controller configured to, upon completion of transfer of the program by the transfer unit, control to disable access from the outside of the non-volatile memory to the first memory region and enable access from the outside of the non-volatile memory to the second memory region, and upon completion of transfer of the program by the transfer unit, the reset unit outputs a reset-release signal to the CPU.

According to the present invention, even if a non-volatile memory such as an MRAM stores programs including a boot program, and is also used as a main memory, it is possible to protect the programs and shorten the activation time of the electronic apparatus.

Further features of the present invention will become apparent from the following description of exemplary embodiments (with reference to the attached drawings).

BRIEF DESCRIPTION OF THE DRAWINGS

FIG. 3 is a table showing the arrangement of programs in an electronic apparatus according to the first, second, or third embodiment of the present invention;

FIG. 10 is a flowchart of the CPU of the electronic apparatus according to the fourth embodiment of the present invention; and FIG. 11 is a table showing the arrangement of programs in the electronic apparatus according to the fourth embodiment of the present invention.

DESCRIPTION OF THE EMBODIMENTS

Each embodiment of the present invention will be described in detail below with reference to the accompanying drawings. Note that an electronic apparatus in which a non-volatile memory (to be described below) is an MRAM or a memory module constituted by an MRAM, and is used as a main memory will be explained.

First Embodiment

Figure 1:
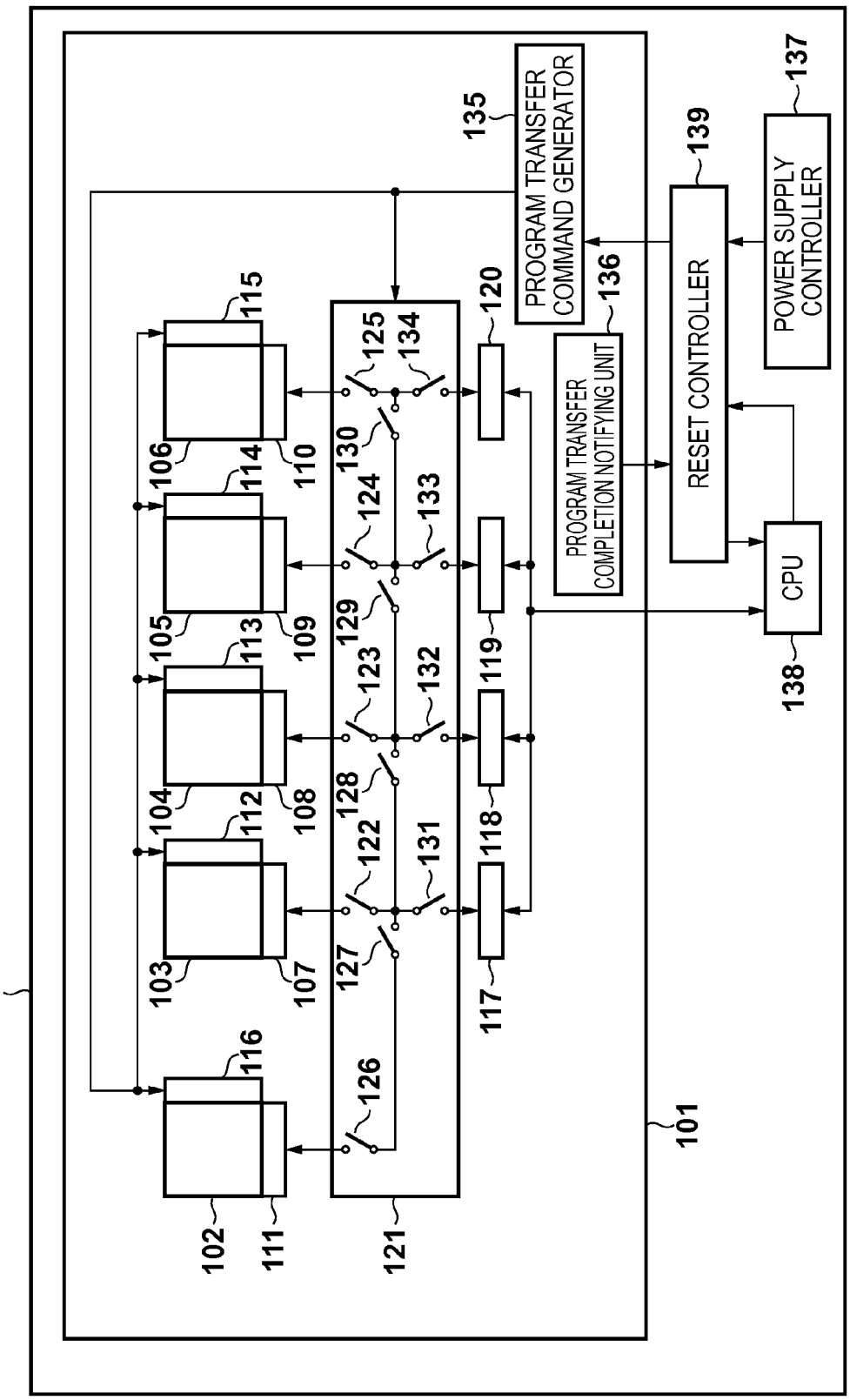
FIG. 1 is a circuit diagram showing the arrangement of an electronic apparatus according to the first embodiment of the present invention.
Figure 2:
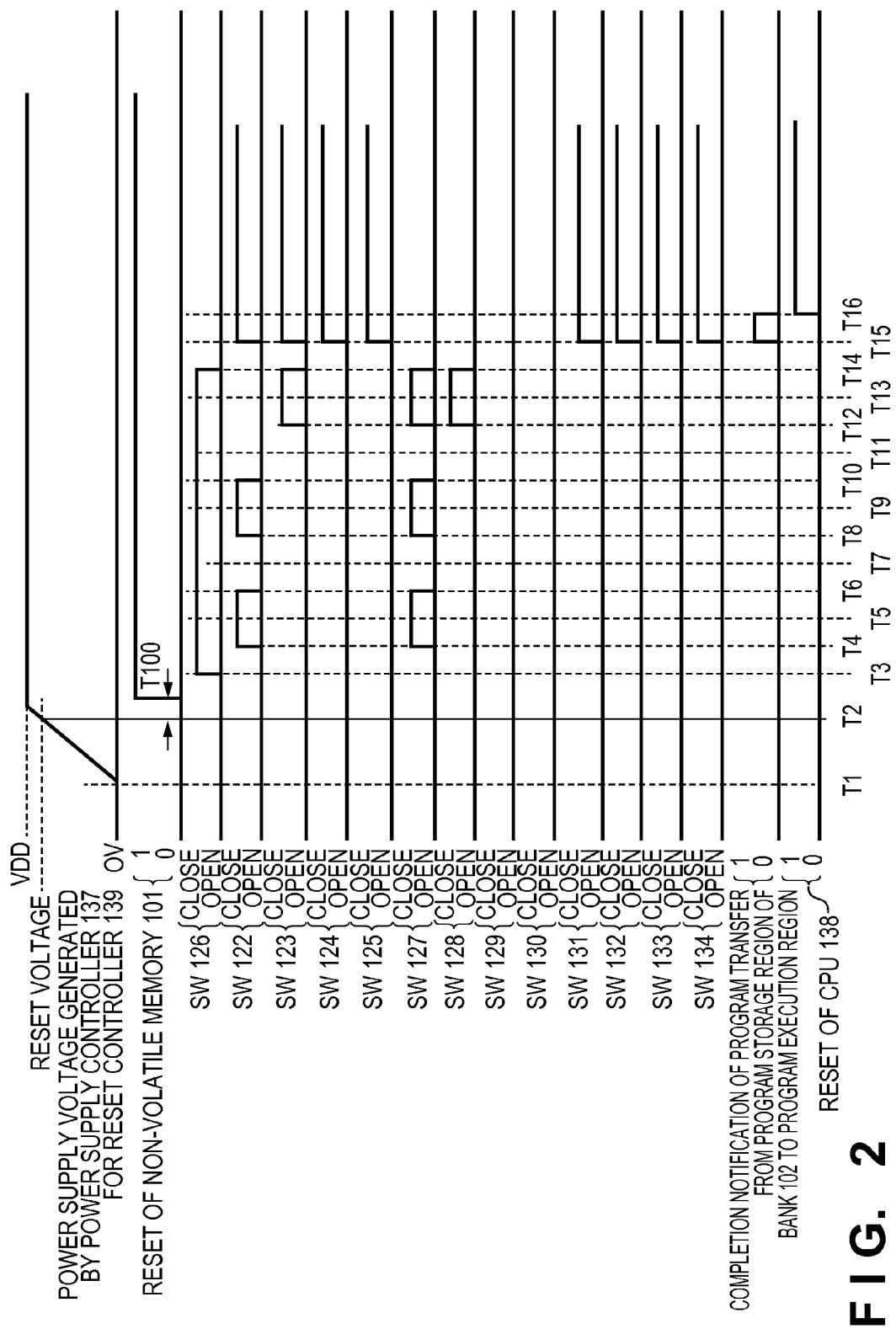
FIG. 2 is a timing chart of the electronic apparatus according to the first embodiment of the present invention.

The first embodiment will be described with reference to FIGS. 1, 2, and 3. Note that the same reference symbols and numerals denote the same components and a description thereof will be omitted. FIG. 1 is a circuit diagram showing the arrangement of an electronic apparatus according to the first embodiment. FIG. 2 is a timing chart according to the first embodiment. FIG. 3 is a table showing the arrangement of programs according to the first embodiment.

In the first embodiment, in an electronic apparatus in which a non-volatile memory storing in advance programs including a boot program is used as a main memory, a program is transferred from a program storage region to a program execution region in the non-volatile memory. This operation attempts to protect the programs including the boot program and shorten the activation time.

Referring to FIG. 1, reference numeral 100 denotes an electronic apparatus according to the first embodiment. Any kinds of apparatuses including an internal processor such as a personal computer, mobile terminal, and digital camera may be used as an electronic apparatus. Reference numeral 101 denotes a non-volatile memory according to the first embodiment. The non-volatile memory 101 is constituted by five banks. Each bank is formed from four pages, and each page includes 4 Kbytes. The non-volatile memory 101, therefore, has a capacity of 80 Kbytes in total. Furthermore, the non-volatile memory 101 has an inter-bank transfer function. The non-volatile memory 101 is configured as a single circuit chip. The non-volatile memory 101 is incorporated in the electronic apparatus 100.

Reference numeral 102 denotes a bank of the non-volatile memory 101, which includes four pages, that is, page 1, page 2, page 3, and page 4. Read access and write access from the outside of the non-volatile memory 101 to the bank 102 are inhibited. The bank 102 also serves as a program storage region that stores the programs including the boot program upon shipping of the electronic apparatus 100.

For example, page 1 of the bank 102 stores the boot program in advance. Page 2 of the bank 102 stores in advance program 1 as one of application programs in the electronic apparatus 100. Page 3 of the bank 102 stores in advance program 2 as one of the application programs in the electronic apparatus 100.

Reference numeral 103 denotes a bank of the non-volatile memory 101, which includes four pages, that is, page 1, page 2, page 3, and page 4, and is used as a program execution region and work region by a CPU 138.

Reference numeral 104 denotes a bank of the non-volatile memory 101, which includes four pages, that is, page 1, page 2, page 3, and page 4, and is used as a program execution region and work region by the CPU 138.

Reference numeral 105 denotes a bank of the non-volatile memory 101, which includes four pages, that is, page 1, page 2, page 3, and page 4, and is used as a program execution region and work region by the CPU 138.

Reference numeral 106 denotes a bank of the non-volatile memory 101, which includes four pages, that is, page 1, page 2, page 3, and page 4, and is used as a program execution region and work region by the CPU 138.

For example, the CPU 138 boots the apparatus by the boot program arranged in page 1 of the bank 103. The CPU 138 executes the application operation using program 1 arranged in page 2 of the bank 103 and program 2 arranged in page 1 of the bank 104.

Reference numeral 107 denotes a sense amplifier of the bank 103; 108, a sense amplifier of the bank 104; 109, a sense amplifier of the bank 105; 110, a sense amplifier of the bank 106; and 111, a sense amplifier of the bank 102. The sense amplifiers 107, 108, 109, 110, and 111 read out pages selected and activated by row decoders 112, 113, 114, 115, and 116, and amplify signals, respectively.

Immediately after the activation of the electronic apparatus 100, that is, when the programs are transferred from the bank 102 to the banks 103, 104, 105, and 106, the row decoder 112 of the bank 103, the row decoder 113 of the bank 104, the row decoder 114 of the bank 105, the row decoder 115 of the bank 106, and the row decoder 116 of the bank 102 activate the pages of the banks controlled and selected by a program transfer command generator 135. When the operation of transferring the programs from the bank 102 to the banks 103, 104, 105, and 106 is complete and the CPU 138 starts to control the electronic apparatus 100, the row decoders 112, 113, 114, 115, and 116 activate the pages of the banks selected by commands sent from the outside of the non-volatile memory 101.

Reference numeral 117 denotes a column decoder of the bank 103; 118, a column decoder of the bank 104; 119, a column decoder of the bank 105; and 120, a column decoder of the bank 106. By controlling a column address by a command sent from the outside of the non-volatile memory 101, each of the column decoders 117, 118, 119, and 120 reads out data in the page read out to the corresponding sense amplifier, and writes data in a page via the corresponding sense amplifier.

Reference numeral 121 denotes a program transfer bus for performing page transfer between different banks, which is formed from a 4096-byte wiring corresponding to the page size of the non-volatile memory 101. The program transfer bus 121 includes the following connection switches. Reference numeral 122 denotes a sense amplifier connection switch which is part of the program transfer bus 121, and selects the connection between the sense amplifier 107 and the program transfer bus 121; 123, a sense amplifier connection switch which is part of the program transfer bus 121, and selects the connection between the sense amplifier 108 and the program transfer bus 121; 124, a sense amplifier connection switch which is part of the program transfer bus 121, and selects the connection between the sense amplifier 109 and the program transfer bus 121; 125, a sense amplifier connection switch which is part of the program transfer bus 121, and selects the connection between the sense amplifier 110 and the program transfer bus 121; and 126, a sense amplifier connection switch which is part of the program transfer bus 121, and selects the connection between the sense amplifier 111 and the program transfer bus 121.

Reference numeral 127 denotes a bank connection switch which is part of the program transfer bus 121, and selects the connection between the banks 102 and 103; 128, a bank connection switch which is part of the program transfer bus 121, and selects the connection between the banks 103 and 104; 129, a bank connection switch which is part of the program transfer bus 121, and selects the connection between the banks 104 and 105; and 130, a bank connection switch which is part of the program transfer bus 121, and selects the connection between the banks 105 and 106.

Reference numeral 131 denotes a column decoder connection switch which is part of the program transfer bus 121, and selects the connection between the column decoder 117 and the program transfer bus 121; 132, a column decoder connection switch which is part of the program transfer bus 121, and selects the connection between the column decoder 118 and the program transfer bus 121; 133, a column decoder connection switch which is part of the program transfer bus 121, and selects the connection between the column decoder 119 and the program transfer bus 121; and 134, a column decoder connection switch which is part of the program transfer bus 121, and selects the connection between the column decoder 120 and the program transfer bus 121.

For example, to transfer data (the boot program or the like) in the program storage region of the bank 102 to the bank 104 according to a command from the program transfer command generator 135, the following processing is performed. In response to activation commands from the program transfer command generator 135 to the banks 102 and 104, the sense amplifier connection switches 126 and 123 and the bank connection switches 127 and 128 are closed. As a result, the banks 102 and 104 are connected to each other. After that, when the program transfer command generator 135 issues a program transfer command, the program is transferred from the bank 102 to the bank 104. Upon completion of the operation of transferring the program from the bank 102 to the bank 104, the sense amplifier connection switches 126 and 123 and the bank connection switches 127 and 128 are initialized to an open state.

The program transfer command generator 135 receives a predetermined reset-release signal from a reset controller 139, and transfers a program between different banks via the program transfer bus 121. Commands issued by the program transfer command generator 135 include activation commands for activating the bank 102 and the banks 103, 104, 105, and 106 of the non-volatile memory 101, and program transfer commands for transferring activated pages.

The activation commands are commands for activating the bank 102 and the banks 103, 104, 105, and 106, respectively. Each activation command contains a signal indicating that specific banks to be activated serve as a program transfer source and a program transfer destination. Alternatively, each activation command contains information indicating whether a bank to be activated serves as a program transfer source or destination. Controlling the connection switches in the program transfer bus 121 by issuing an activation command makes it possible to transfer a program between a plurality of banks. The program transfer command generator 135 includes a memory element such as a ROM or EFUSE that is unrewritable (read only) after shipping of the electronic apparatus 100. The unrewritable memory element stores information about the storage region of the program transferred at the time of reset and the storage region of the transfer destination. For example, the boot program stored in advance in page 1 of the bank 102 is set to be transferred to page 1 of the bank 103. Program 1 stored in page 2 of the bank 102 is set to be transferred to page 1 of the bank 104. Program 2 stored in page 3 of the bank 102 is set to be transferred to page 2 of the bank 103.

Reference numeral 136 denotes a program transfer completion notifying unit. Upon completion of transfer of a program from the bank 102 to the program execution region of the bank 103 or the like except for the bank 102 in the non-volatile memory 101, the program transfer completion notifying unit 136 notifies the reset controller 139 of program transfer completion. Reference numeral 137 denotes a power supply controller which manages power supply of the electronic apparatus 100 by a user operation. The CPU 138 controls the electronic apparatus 100. In response to the reset-release signal from the reset controller 139, the CPU 138 accesses a predetermined storage region of the non-volatile memory 101 to activate the apparatus using the boot program. Also, the CPU 138 accesses the non-volatile memory 101, and executes a program, thereby controlling the electronic apparatus 100 after activation. The reset controller 139 monitors power-on of the electronic apparatus 100, and controls a reset application signal and reset-release signal to the CPU 138 and non-volatile memory 101. When power is supplied from the power supply controller 137, the reset controller 139 sends a reset-release signal to the non-volatile memory 101. When the program transfer completion signal is received from the program transfer completion notifying unit 136, the reset controller 139 sends a reset-release signal to the CPU 138.

The operation of the electronic apparatus 100 of this embodiment is explained with reference to the timing chart shown in FIG. 2. In this embodiment, it is possible to protect the programs in the program region of the bank 102 storing originals and shorten the activation time of the electronic apparatus 100 by transferring the programs including the boot program from the program storage region of the bank 102 to the banks 103 and 104 in the non-volatile memory 101. The non-volatile memory 101 is divided into the five banks, and has a page size of 4 Kbytes, a bank capacity of 16 Kbytes, and a total capacity of 80 Kbytes. Note that SWs 122-134 in FIG. 2 correspond to switches 122-134 included in the program program transfer bus 121 shown in FIG. 1.

In this embodiment, the normal operation of the electronic apparatus 100 without any program update such as firmware update of the program stored in advance in the program storage region of the bank 102 of the non-volatile memory 101 will be explained.

In this embodiment, assume that in the program storage region of the bank 102, the boot program is stored in advance in page 1, program 1 is stored in advance in page 2, and program 2 is stored in advance in page 3, as shown in FIG. 3. Assume also that the program transfer command generator 135 is set to transfer, upon power-on or reset, the boot program to page 1 of the bank 103, program 1 to page 1 of the bank 104, and program 2 to page 2 of the bank 103.

When the user powers on the electronic apparatus 100 in which such settings are made, a power supply voltage from the power supply controller 137 starts to rise at a timing T1. After a period from a timing T2 at which the power supply voltage reaches a reset voltage to a timing T100, the reset controller 139 sends a reset-release signal to the non-volatile memory 101, and opens the sense amplifier connection switches 122, 123, 124, 125, and 126, the bank connection switches 127, 128, 129, and 130, and the column decoder connection switches 131, 132, 133, and 134.

At a timing T3, the program transfer command generator 135 issues an activation command to the bank 102 to activate the bank 102. Also, to cause the bank 102 to function as a transfer source bank, the sense amplifier connection switch 126 is closed at a predetermined timing.

At a timing T4, the program transfer command generator 135 issues an activation command to the bank 103 to activate page 1 of the bank 103. Also, to cause the bank 103 to function as a transfer destination bank, the sense amplifier connection switch 122 is closed at a predetermined timing. Furthermore, the bank connection switch 127 is closed to connect the banks 102 and 103.

At a timing T5 at which data is read out to the sense amplifier 111, the program transfer command generator 135 issues a program transfer command. As a result, the boot program read out to the sense amplifier 111 is transferred to the bank 103 via the sense amplifier 107. At a timing T6 at which transfer of the boot program ends, the sense amplifier connection switch 122 and the bank connection switch 127 are opened. At a timing T7, the program transfer command generator 135 issues an activation command to the bank 102 to activate page 3 of the bank 102. The program transfer command generator 135 issues an activation command to the bank 103 to activate page 2 of the bank 103 at a timing T8, and also closes the sense amplifier connection switch 122 at a predetermined timing to cause the bank 103 to function as a transfer destination bank. The bank connection switch 127 is closed to connect the banks 102 and 103.

At a timing T9 at which data is read out to the sense amplifier 111, the program transfer command generator 135 issues a program transfer command to transfer, to the bank 103 via the sense amplifier 107, program 2 read out to the sense amplifier 111. At a timing T10 at which transfer of program 2 ends, the sense amplifier connection switch 122 and the bank connection switch 127 are opened. At a timing T11, the program transfer command generator 135 issues an activation command to the bank 102 to activate page 2 of the bank 102. The program transfer command generator 135 issues an activation command to the bank 104 to activate page 1 of the bank 104 at a timing T12, and also closes the sense amplifier connection switch 123 at a predetermined timing to cause the bank 104 to function as a transfer destination bank. Furthermore, the bank connection switches 127 and 128 are closed to connect the banks 102 and 104.

At a timing T13 at which data is read out to the sense amplifier 111, the program transfer command generator 135 issues a program transfer command to transfer, to the bank 104 via the sense amplifier 108, program 1 read out to the sense amplifier 111. At a timing T14 at which transfer of program 1 ends, the sense amplifier connection switches 126 and 123 and the bank connection switches 127 and 128 are opened, and thus the connection switches return to the initial state. In the initial state, at least the sense amplifier connection switch 126 is open.

At a timing T15 at which transfer of the programs from the bank 102 to the banks 103, 104, 105, and 106 is completed, the program transfer completion notifying unit 136 notifies the reset controller 139 of program transfer completion. The sense amplifier connection switches 122, 123, 124, and 125 are closed. Furthermore, the column decoder connection switches 131, 132, 133, and 134 are closed. At a timing T16, the reset controller 139 sends a reset-release signal to the CPU 138. As a result, the CPU 138 of the electronic apparatus 100 accesses page 1 of the bank 103 to activate the apparatus using the boot program stored in page 1, thereby starting an operation.

Consequently, in response to completion of program transfer in the non-volatile memory 101, the CPU 138 of the electronic apparatus 100 activates the apparatus according to the boot program. At this time, the bank 102 of the non-volatile memory 101 has already been disconnected from the outside (the CPU 138) of the non-volatile memory 101, and cannot thus be accessed. Therefore, even if the CPU 138 goes out of control, the programs including the boot program stored and held in the program storage region of the bank 102 of the non-volatile memory 101 are protected.

Since the program is transferred in the non-volatile memory 101 without accessing the memory from the CPU 138 or using DMA (not shown) via the external bus of the non-volatile memory 101, it is possible to shorten the activation time of the electronic apparatus 100.

Although the first embodiment has been described above, the present invention is not limited to this, and various modifications and changes can be made within the spirit and scope of the present invention.

Second Embodiment

Figure 4:
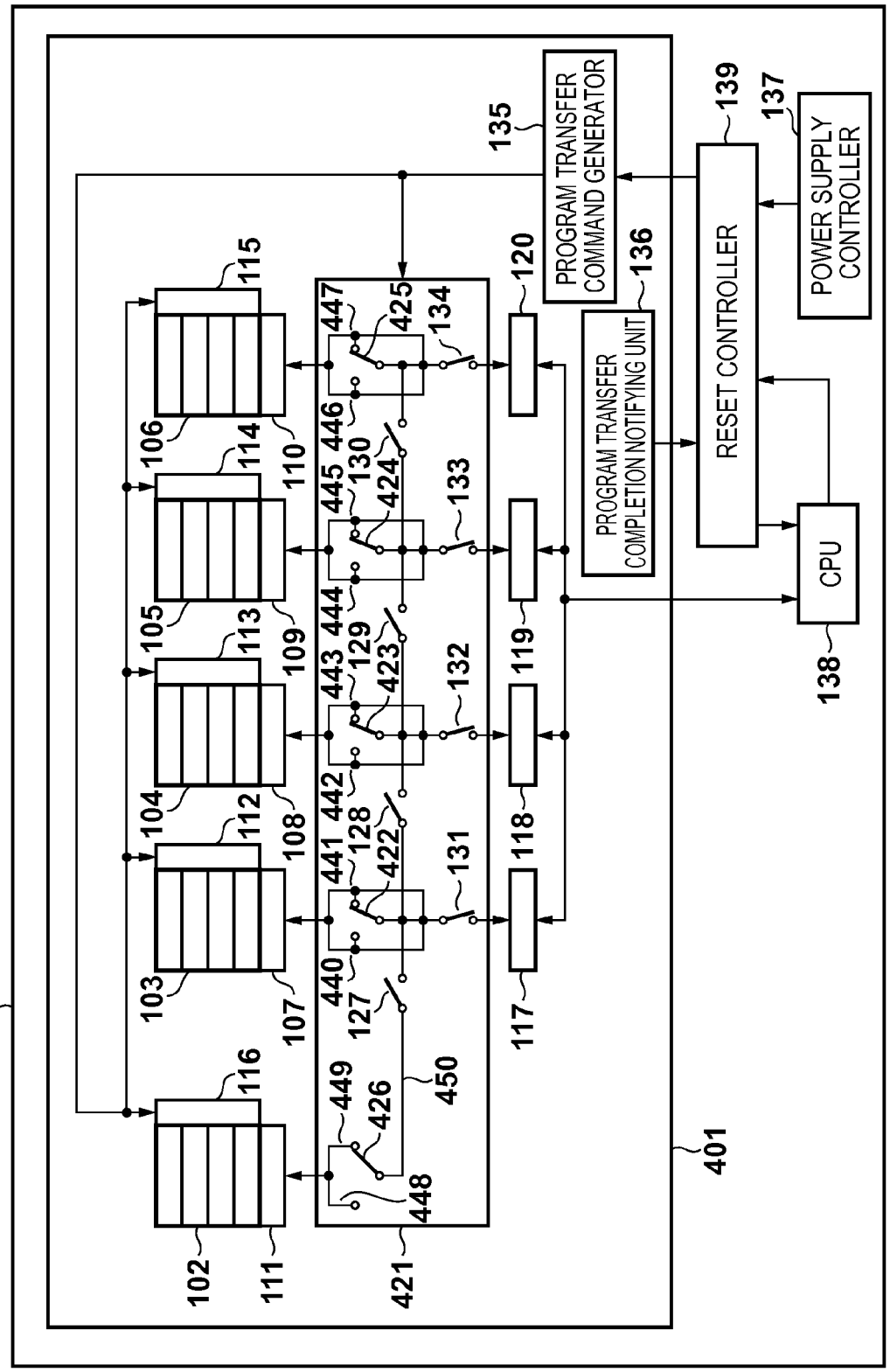
FIG. 4 is a circuit diagram showing the arrangement of the electronic apparatus according to the second embodiment of the present invention.
Figure 5:
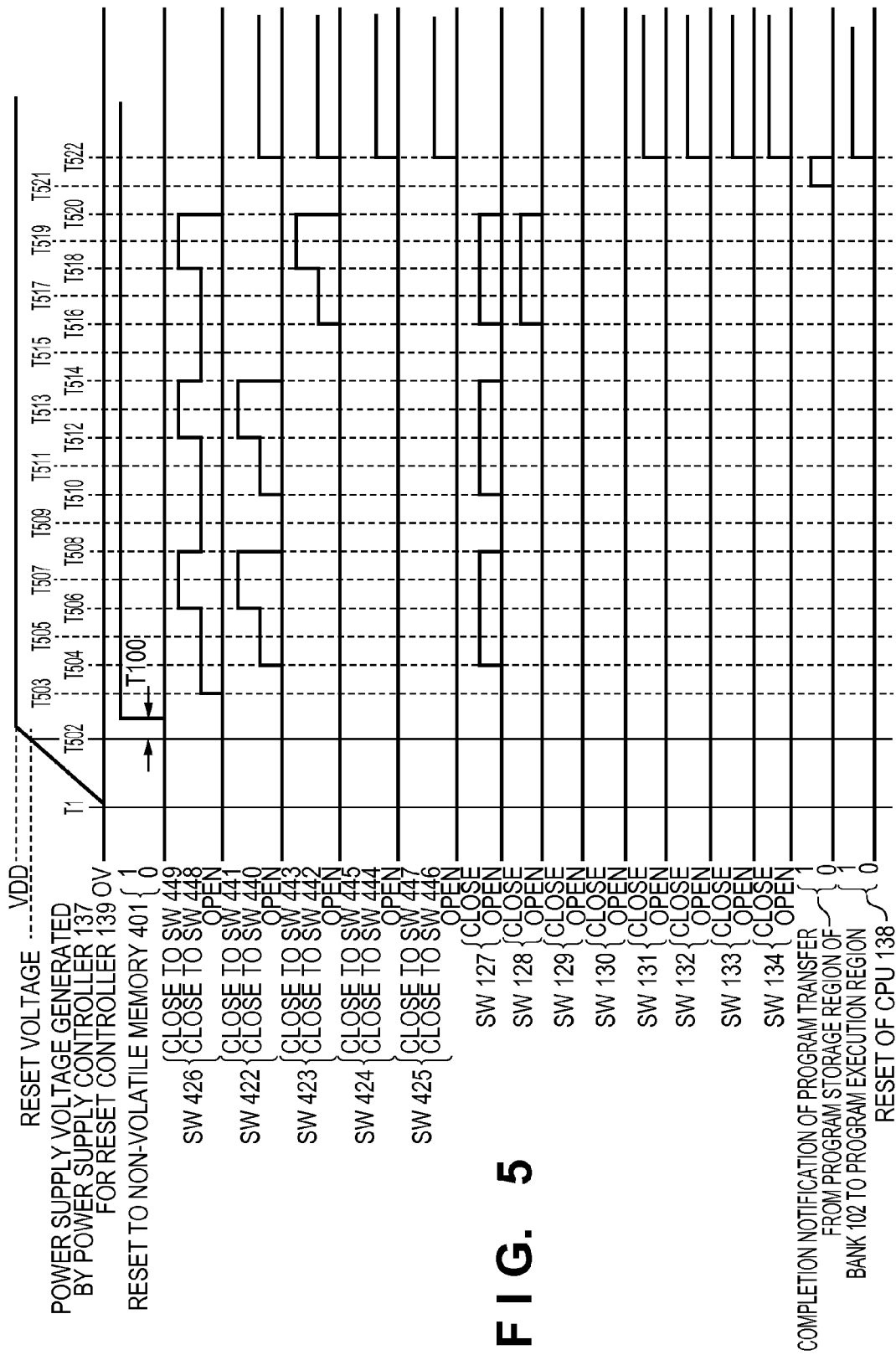
FIG. 5 is a timing chart of the electronic apparatus according to the second embodiment of the present invention.

The second embodiment will be described with reference to FIGS. 3, 4, and 5. Note that the same reference symbols and numerals as those in the first embodiment denote the same components and a description thereof will be omitted. FIG. 3 is a table showing the arrangement of programs according to the second embodiment of the present invention. FIG. 4 is a circuit diagram showing the arrangement of an electronic apparatus according to the second embodiment. FIG. 5 is a timing chart according to the second embodiment.

Referring to FIG. 4, reference numeral 400 denotes an electronic apparatus according to the second embodiment. The electronic apparatus 400 need only be an apparatus incorporating a processor, and any kinds of apparatuses may be used, as in the first embodiment. Reference numeral 401 denotes a non-volatile memory according to the second embodiment. The non-volatile memory 401 is constituted by five banks. Each bank is formed from four pages, and each page includes 4 Kbytes. The non-volatile memory 401, therefore, has a capacity of 80 Kbytes in total. Furthermore, the non-volatile memory 401 has an inter-bank transfer function. Reference numeral 421 denotes a program transfer bus for performing page transfer between different banks. The program transfer bus 421 is formed from the following wiring. Reference numeral 450 denotes a page transfer bus between different banks, which is formed from a 2048-byte wiring for performing page transfer between different banks in the program transfer bus 421.

A wiring between the program transfer bus 421 and each of sense amplifiers 107, 108, 109, 110, and 111 has a width of 4 Kbytes, and is divided into a wiring for 2048-byte data at column addresses 0x0 to 0x7FF, and a wiring for 2048-byte data at column addresses 0x800 to 0xFFF in the program transfer bus 421.

Reference numeral 440 denotes a sense amplifier low input/output for connecting 2048-byte data at the column addresses 0x0 to 0x7FF of the sense amplifier 107 to the program transfer bus 421.

Reference numeral 441 denotes a sense amplifier high input/output for connecting 2048-byte data at the column addresses 0x800 to 0xFFF of the sense amplifier 107 to the program transfer bus 421.

Reference numeral 442 denotes a sense amplifier low input/output for connecting 2048-byte data at the column addresses 0x0 to 0x7FF of the sense amplifier 108 to the program transfer bus 421; and 443, a sense amplifier high input/output for connecting 2048-byte data at the column addresses 0x800 to 0xFFF of the sense amplifier 108 to the program transfer bus 421.

Reference numeral 444 denotes a sense amplifier low input/output for connecting 2048-byte data at the column addresses 0x0 to 0x7FF of the sense amplifier 109 to the program transfer bus 421; and 445, a sense amplifier high input/output for connecting 2048-byte data at the column addresses 0x800 to 0xFFF of the sense amplifier 109 to the program transfer bus 421.

Reference numeral 446 denotes a sense amplifier low input/output for connecting 2048-byte data at the column addresses 0x0 to 0x7FF of the sense amplifier 110 to the program transfer bus 421; and 447, a sense amplifier high input/output for connecting 2048-byte data at the column addresses 0x800 to 0xFFF of the sense amplifier 110 to the program transfer bus 421.

Reference numeral 448 denotes a sense amplifier low input/output for connecting 2048-byte data at the column addresses 0x0 to 0x7FF of the sense amplifier 111 to the program transfer bus 421; and 449, a sense amplifier high input/output for connecting 2048-byte data at the column addresses 0x800 to 0xFFF of the sense amplifier 111 to the program transfer bus 421.

A wiring of the program transfer bus 421 with each of column decoders 117, 118, 119, and 120 has a width of 4 Kbytes. In the program transfer bus 421, a wiring for 2048-byte data at the column addresses 0x0 to 0x7FF is connected to a wiring for 2048-byte data at the column addresses 0x800 to 0xFFF.

The program transfer bus 421 includes the following connection switches. Reference numeral 422 denotes a sense amplifier connection switch which is part of the program transfer bus 421, and selects the sense amplifier low input/output 440 or sense amplifier high input/output 441 and the connection of the program transfer bus 421.

Reference numeral 423 denotes a sense amplifier connection switch which is part of the program transfer bus 421, and selects the sense amplifier low input/output 442 or sense amplifier high input/output 443 and the connection of the program transfer bus 421; and 424, a sense amplifier connection switch which is part of the program transfer bus 421, and selects the sense amplifier low input/output 444 or sense amplifier high input/output 445 and the connection of the program transfer bus 421.

Reference numeral 425 denotes a sense amplifier connection switch which is part of the program transfer bus 421, and selects the sense amplifier low input/output 446 or sense amplifier high input/output 447 and the connection of the program transfer bus 421; and 426, a sense amplifier connection switch which is part of the program transfer bus 421, and selects the sense amplifier low input/output 448 or sense amplifier high input/output 449 and the connection of the program transfer bus 421.

When, for example, a program in the program storage region of a bank 102 is transferred to a bank 104 in response to a command from a program transfer command generator 135, the following procedure is performed.

In response to activation commands from the program transfer command generator 135 to the banks 102 and 104, the sense amplifiers 111 and 107 are activated, respectively. The sense amplifier connection switch 426 is closed to the sense amplifier low input/output 448, the sense amplifier connection switch 423 is closed to the sense amplifier low input/output 442, bank connection switches 127 and 128 are closed, and 2048-byte data at the column addresses 0x0 to 0x7FF of the bank 102 and 2048-byte data at the column addresses 0x0 to 0x7FF of the bank 104 are connected.

When the program transfer command generator 135 issues a program transfer command, 2048-byte data at the column addresses 0x0 to 0x7FF of the sense amplifier 111 of the bank 102 are transferred to the bank 104 via the sense amplifier 107.

Subsequently, the sense amplifier connection switch 426 is closed to the sense amplifier high input/output 449, the sense amplifier connection switch 423 is closed to the sense amplifier high input/output 443, and 2048-byte data at the column addresses 0x800 to 0xFFF of the bank 102 and 2048-byte data at the column addresses 0x800 to 0xFFF of the bank 104 are connected.

In this state, 2048-byte data at the column addresses 0x800 to 0xFFF of the sense amplifier 111 of the bank 102 are transferred to the bank 104 via the sense amplifier 107.

The sense amplifier connection switches 426 and 423 and the bank connection switches 127 and 128 are initialized to the open state.

The operation of the electronic apparatus 100 of this embodiment will be explained with reference to the timing chart shown in FIG. 5. In this embodiment, it is possible to protect programs including a boot program and shorten the activation time of the electronic apparatus 400 by transferring the programs from the bank 102 to a bank 103 and the bank 104 in the non-volatile memory 401.

In this embodiment, the normal operation of the electronic apparatus 400 without any program update such as firmware update of the program stored in advance in the program storage region of the bank 102 of the non-volatile memory 401 will be explained.

In this embodiment, as shown in FIG. 3, in the program storage region of the bank 102, the boot program is stored in advance in page 1, program 1 is stored in advance in page 2, and program 2 is stored in advance in page 3.

The program transfer command generator 135 is set to transfer the boot program to page 1 of the bank 103, program 1 to page 1 of the bank 104, and program 2 to page 2 of the bank 103 as processing upon activation of the electronic apparatus 400. Processing at a timing T1 is the same as that in the first embodiment.

After a period from a timing T502 at which a power supply voltage reaches a reset voltage to a timing T100, a reset controller 139 sends a reset-release signal to the non-volatile memory 401, and opens the sense amplifier connection switches 422, 423, 424, 425, and 426, bank connection switches 427, 428, 429, and 430, and column decoder connection switches 431, 432, 433, and 434.

At a timing T503, the program transfer command generator 135 issues an activation command to the bank 102 to activate page 1 of the bank 102 in which the boot program is stored. Also, to cause the bank 102 to function as transfer source bank, the program transfer command generator 135 closes the sense amplifier connection switch 426 to the sense amplifier low input/output 448 at a predetermined timing.

At a timing T504, the program transfer command generator 135 issues an activation command to the bank 103 to activate page 1 of the bank 103. Also, to cause the bank 103 to function as a transfer destination, the program transfer command generator 135 closes the sense amplifier connection switch 422 to the sense amplifier low input/output 440 at a predetermined timing. Furthermore, the program transfer command generator 135 closes the bank connection switch 127 to connect the banks 102 and 103.

At a timing T505 at which data is read out to the sense amplifiers 111 and 107, the program transfer command generator 135 issues a program transfer command, and starts to transfer, to the bank 103 via the sense amplifier 107, 2048-byte data at the column addresses 0x0 to 0x7FF of the boot program read out to the sense amplifier 111 via the page transfer bus 450 between different banks.

At a timing T506 at which transfer of the 2048-byte data at the column addresses 0x0 to 0x7FF of the sense amplifier 111 ends, the program transfer command generator 135 issues a command, and closes the sense amplifier connection switch 426 to the sense amplifier high input/output 449. The program transfer command generator 135 issues a command, and closes the sense amplifier connection switch 422 to the sense amplifier high input/output 441.

At a timing T507, the sense amplifier connection switch 426 is closed to the sense amplifier high input/output 449, and the sense amplifier connection switch 422 is closed to the sense amplifier high input/output 441. An operation of transferring, to the bank 103 via the sense amplifier 107, 2048-byte data at the column addresses 0x800 to 0xFFF of the boot program read out to the sense amplifier 111 via the page transfer bus 450 between different banks starts.

At a timing T508 at which transfer of the 2048-byte data at the column addresses 0x800 to 0xFFF of the sense amplifier 111 ends, the program transfer command generator 135 issues a command, and opens the sense amplifier connection switch 422 and bank connection switch 127. Also, the sense amplifier connection switch 426 is closed to the sense amplifier low input/output 448.

At a timing T509, the program transfer command generator 135 issues an activation command to the bank 102 and an activation command to page 3 of the bank 102 in which program 2 is stored, thereby activating page 3 of the bank 102.

The program transfer command generator 135 issues an activation command to the bank 103 to activate page 2 of the bank 103 at a timing T510, and also closes the sense amplifier connection switch 422 to the sense amplifier low input/output 440 at a predetermined timing to cause the bank 103 to function as a transfer destination. Furthermore, the bank connection switch 127 is closed to connect the banks 102 and 103.

At a timing T511 at which data is read out to the sense amplifiers 111 and 107, the program transfer command generator 135 issues a program transfer command, and starts to transfer, to the bank 103 via the sense amplifier 107, 2048-byte data at the column addresses 0x0 to 0x7FF of the program 2 read out to the sense amplifier 111 via the page transfer bus 450 between the different banks.

At a timing T512 at which transfer of the 2048-byte data at the column addresses 0x0 to 0x7FF of the sense amplifier 111 ends, the program transfer command generator 135 issues a command, and closes the sense amplifier connection switch 426 to the sense amplifier high input/output 449. Furthermore, the sense amplifier connection switch 422 is closed to the sense amplifier high input/output 441.

At a timing T513, the sense amplifier connection switch 426 is closed to the sense amplifier high input/output 449, and the sense amplifier connection switch 422 is closed to the sense amplifier high input/output 441. At this timing, an operation of transferring, to the bank 103 via the sense amplifier 107, 2048-byte data at the column addresses 0x800 to 0xFFF of program 2 read out to the sense amplifier 111 via the page transfer bus 450 between different banks starts.

At a timing T514 at which transfer of the 2048-byte data at the column addresses 0x800 to 0xFFF of the boot program ends, the program transfer command generator 135 issues a command to open the sense amplifier connection switch 422 and the bank connection switch 127. Also, the sense amplifier connection switch 426 is closed to the sense amplifier low input/output 448.

At a timing T515, the program transfer command generator 135 issues an activation command to the bank 102 and an activation command to page 2 of the bank 102 in which program 1 is stored, thereby activating page 2 of the bank 102.

The program transfer command generator 135 issues an activation command to the bank 104 to activate page 1 of the bank 104 at a timing T516, and also closes the sense amplifier connection switch 423 to the sense amplifier low input/output 442 at a predetermined timing to cause the bank 104 to function as a transfer destination. Furthermore, the bank connection switches 127 and 128 are closed to connect the banks 102 and 104.

At a timing T517 at which data is read out to the sense amplifiers 111 and 108, the program transfer command generator 135 issues a program transfer command, and starts to transfer, to the bank 104 via the sense amplifier 108, 2048-byte data at the column addresses 0x0 to 0x7FF of program 1 read out to the sense amplifier 111 via the page transfer bus 450 between different banks.

At a timing T518 at which transfer of the 2048-byte data at the column addresses 0x0 to 0x7FF of the sense amplifier 111 ends, the program transfer command generator 135 issues a command to close the sense amplifier connection switch 426 to the sense amplifier high input/output 449. Furthermore, the sense amplifier connection switch 423 is closed to the sense amplifier high input/output 443.

At a timing T519, the sense amplifier connection switch 426 is closed to the sense amplifier high input/output 449, and the sense amplifier connection switch 423 is closed to the sense amplifier high input/output 443. At this timing, an operation of transferring, to the bank 104 via the sense amplifier 108, 2048-byte data at the column addresses 0x800 to 0xFFF of program 1 read out to the sense amplifier 111 via the page transfer bus 450 between different banks starts.

At a timing T520 at which transfer of the 2048-byte data at the column addresses 0x800 to 0xFFF of the boot program ends, the program transfer command generator 135 issues a command to open the sense amplifier connection switches 426 and 422 and the bank connection switches 127 and 128, and thus the connection switches return to the initial state.

At a timing T521 at which transfer of the programs from the program storage region of the bank 102 to the banks 103 and 104 is completed, a program transfer completion notifying unit 136 notifies the reset controller 139 of program transfer completion. The program transfer command generator 135 issues a command to close the sense amplifier connection switches 422, 423, and 424. Furthermore, the column decoder connection switches 131, 132, 133, and 134 are closed.

At a timing T522, the reset controller 139 outputs a reset-release signal to a CPU 138. As a result, the electronic apparatus 400 (CPU 138) is activated by the boot program, thereby starting the operation.

With this arrangement, the program storage region of the bank 102 is not accessed from the outside of the non-volatile memory 401, thereby protecting the programs including the boot program. Since inter-bank transfer from the bank 102 to another bank is performed, it is possible to execute boot processing and another program processing at high speed.

Furthermore, since the program is transferred in the non-volatile memory 401 without accessing the memory from the CPU 138 or using DMA (not shown) via the external bus of the non-volatile memory 401, it is possible to shorten the activation time of the electronic apparatus 400.

The preferred embodiment of the present invention has been described above. The present invention, however, is not limited to this, and various modifications and changes can be made within the spirit and scope of the present invention.

Third Embodiment

Figure 6:
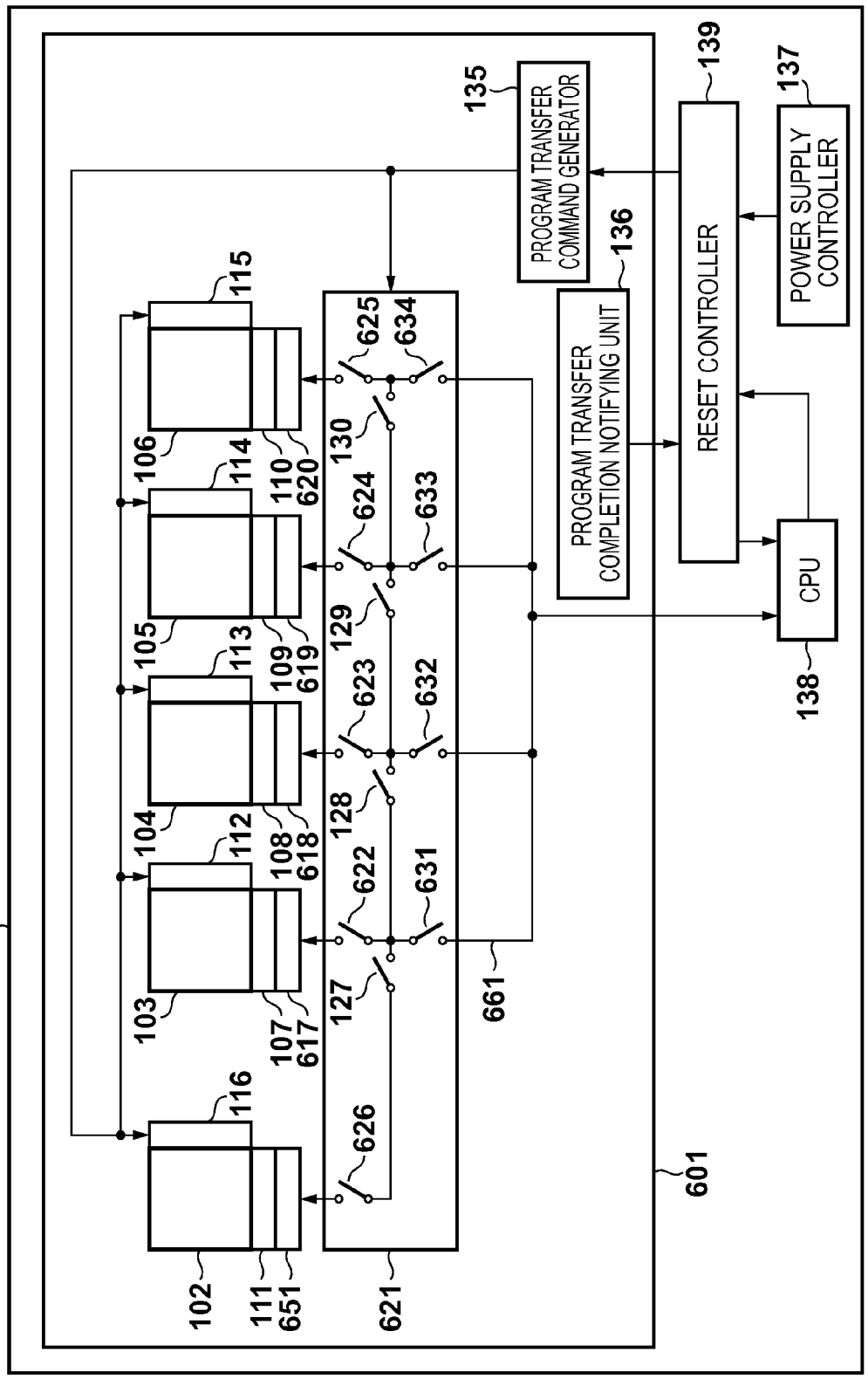
FIG. 6 is a circuit diagram showing the arrangement of the electronic apparatus according to the third embodiment of the present invention.
Figure 7:
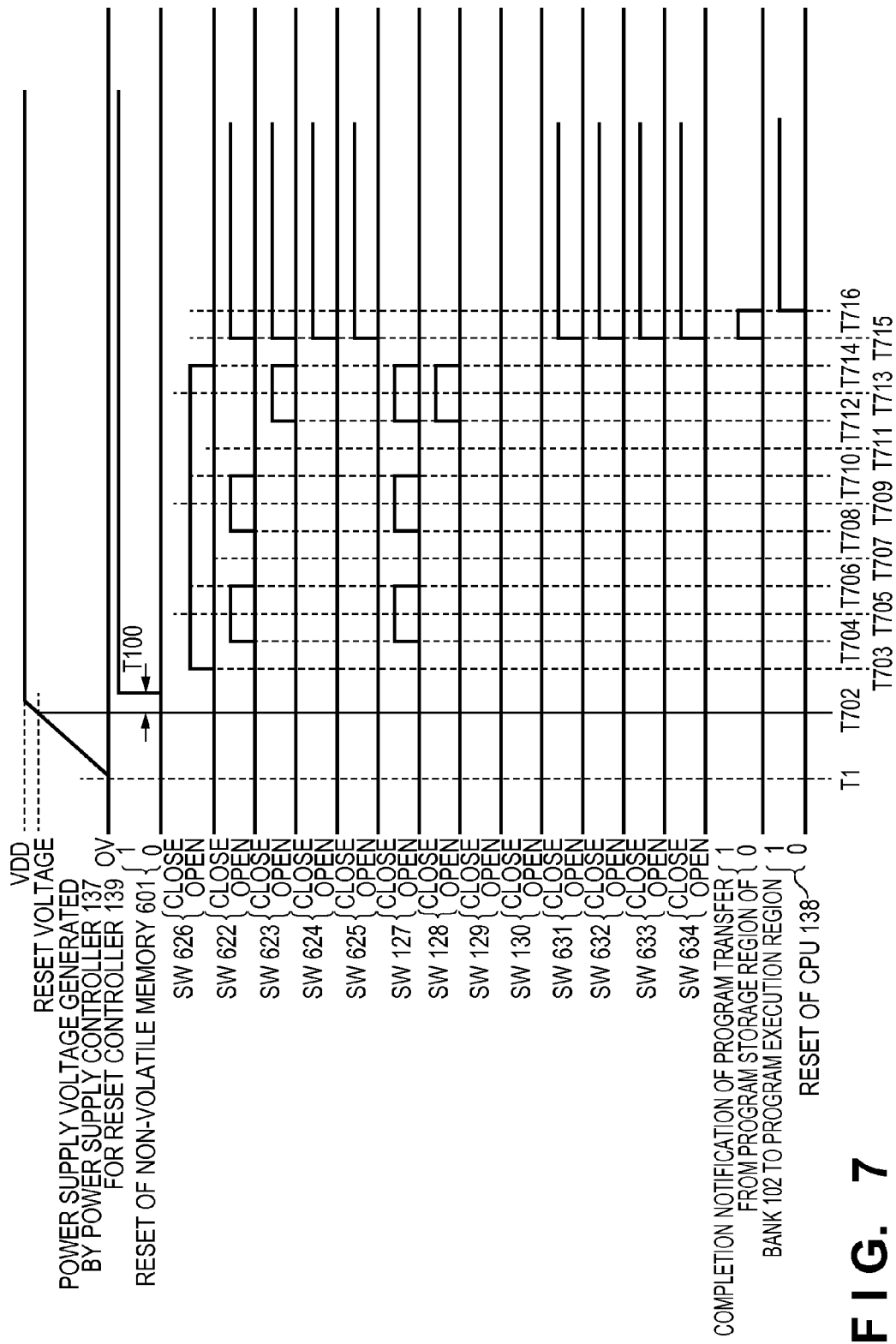
FIG. 7 is a timing chart of the electronic apparatus according to the third embodiment of the present invention.

The third embodiment will be described with reference to FIGS. 3, 6, and 7. Note that the same reference symbols and numerals as those in the first embodiment denote the same components and a description thereof will be omitted. FIG. 3 is a table showing the arrangement of programs according to the third embodiment of the present invention. FIG. 6 is a circuit diagram showing the arrangement of an electronic apparatus according to the third embodiment. FIG. 7 is a timing chart according to the third embodiment.

Referring to FIG. 6, reference numeral 600 denotes an electronic apparatus according to the third embodiment. The electronic apparatus 600 need only be an apparatus incorporating a processor, and any kinds of apparatuses may be used. Reference numeral 601 denotes a non-volatile memory according to the third embodiment. The non-volatile memory 601 has a page size of 4 Kbytes, a bank capacity of 16 Kbytes, and a total capacity of 80 Kbytes, and has an external bus width of 32 bits. Programs including a boot program are stored in advance in a bank 102 of the non-volatile memory 601. The non-volatile memory 601 can internally perform page transfer between banks.

Reference numeral 617 denotes a column decoder of a bank 103; 618, a column decoder of a bank 104; 619, a column decoder of a bank 105; 620, a column decoder of a bank 106; and 651, a column decoder of the bank 102.

The column decoders 617, 618, 619, 620, and 651 control column addresses when respectively transferring programs from the program storage region of the bank 102 to the banks 103, 104, 105, and 106 by access from a program transfer command generator 135 immediately after activation of the electronic apparatus 600.

Upon completion of transfer of the programs to the banks 103, 104, 105, and 106, a CPU 138 starts to control the electronic apparatus 600. At this time, the column addresses are controlled by a command from the CPU 138 outside the non-volatile memory 601, thereby reading out data in a page read out to a sense amplifier, and writing data via the sense amplifier.

Reference numeral 621 denotes a program transfer bus for transferring data between a plurality of banks, which has the same bus width of 32 bits as that of the external bus of the non-volatile memory 601. The program transfer bus 621 includes the following connection switches. Reference numeral 661 denotes an external data bus of the non-volatile memory 601 with the 32-bit width. Reference numeral 622 denotes a column decoder connection switch which is part of the program transfer bus 621, and selects the connection between the column decoder 617 and the program transfer bus 621; 623, a column decoder connection switch which is part of the program transfer bus 621, and selects the connection between the column decoder 618 and the program transfer bus 621; 624, a column decoder connection switch which is part of the program transfer bus 621, and selects the connection between the column decoder 619 and the program transfer bus 621; 625, a column decoder connection switch which is part of the program transfer bus 621, and selects the connection between the column decoder 620 and the program transfer bus 621; and 626, a column decoder connection switch which is part of the program transfer bus 621, and selects the connection between the column decoder 651 and the program transfer bus 621. Furthermore, reference numeral 631 denotes an external data bus connection switch which is part of the program transfer bus 621, and selects the connection between the program transfer bus 621 and the external data bus 661; 632, an external data bus connection switch which is part of the program transfer bus 621, and selects the connection between the program transfer bus 621 and the external data bus 661; 633, an external data bus connection switch which is part of the program transfer bus 621, and selects the connection between the program transfer bus 621 and the external data bus 661; and 634, an external data bus connection switch which is part of the program transfer bus 621, and selects the connection between the program transfer bus 621 and the external data bus 661.

For example, a processing procedure when a program is transferred from the bank 102 to the bank 104 according to a command from the program transfer command generator 135 upon power-on or reset is as follows.

The program transfer command generator 135 issues activation commands to the banks 102 and 104 to close the column decoder connection switches 626 and 623 and bank connection switches 127 and 128, thereby connecting the banks 102 and 104.

The program transfer command generator 135 issues a program transfer command. In response to this, the column decoder 651 reads out data at column addresses 0x0 to 0xFFF from a sense amplifier 111.

At the same time, the column decoder 618 writes the data read out by the column decoder 651 at the column addresses 0x0 to 0xFFF in the sense amplifier 108, thereby transferring the program.

When transfer of the program from the program storage region of the bank 102 to the bank 104 is complete, the program transfer command generator 135 initializes the column decoder connection switches 626 and 623 and the bank connection switches 127 and 128 to an open state.

The operation of the electronic apparatus 100 of this embodiment will be described below with reference to the timing chart shown in FIG. 7. In this embodiment, it is possible to protect the programs including the boot program and shorten the activation time of the electronic apparatus 600 by transferring the programs from the program storage region of the bank 102 to the banks 103 and 104 in the non-volatile memory 601.

In the third embodiment, the normal operation of the electronic apparatus 600 without any update of the programs stored in advance in the program storage region of the bank 102 of the non-volatile memory 601 will be explained.

In the third embodiment, as shown in FIG. 3, in the program storage region of the bank 102, the boot program is stored in advance in page 1, program 1 is stored in advance in page 2, and program 2 is stored in advance in page 3.

It is set to transfer, upon activation of the electronic apparatus 600, the boot program to page 1 of the bank 103, program 1 to page 1 of the bank 104, and program 2 to page 2 of the bank 103.

Processing at a timing T1 is the same as that in the first embodiment. After a period from a timing T702 at which a power supply voltage reaches a reset voltage to a timing T100, a reset controller 139 sends a reset-release signal to the non-volatile memory 601, and opens the column decoder connection switches 622, 623, 624, 625, and 626, bank connection switches 627, 628, 629, and 630, and the external data bus connection switches 631, 632, 633, and 634.

The program transfer command generator 135 issues an activation command to the bank 102 to activate page 1 of the bank 102 at a timing T703, and also closes the column decoder connection switch 626 at a predetermined timing to cause the bank 102 to function as transfer source bank.

The program transfer command generator 135 issues an activation command to the bank 103 to activate page 1 of the bank 103 at a timing T704, and also closes the column decoder connection switch 622 at a predetermined timing to designate the bank 103 as a destination. Furthermore, the bank connection switch 127 is closed to connect the banks 102 and 103.

At a timing T705 at which data is read out to the sense amplifier 111 and a sense amplifier 107, the program transfer command generator 135 issues a program transfer command, and starts to transfer the boot program read out to the sense amplifier 111 via an external data bus.

At a timing T706 at which transfer of the boot program ends, the column decoder connection switch 622 and the bank connection switch 127 are opened, and thus the connection switches return to the initial state.

At a timing T707, the program transfer command generator 135 issues an activation command to the bank 102 to activate page 3 of the program storage region of the bank 102. The program transfer command generator 135 issues an activation command to the bank 103 to activate page 2 of the bank 103 at a timing T708, and also closes the column decoder connection switch 622 at a predetermined timing to cause the bank 103 to function as a transfer destination bank. Furthermore, the bank connection switch 127 is closed to connect the banks 102 and 103.

At a timing T709 at which data is read out to the sense amplifiers 111 and 107, the program transfer command generator 135 issues a program transfer command, and starts to transfer, via the external data bus, program 2 read out to the sense amplifier 111.

At a timing T710 at which transfer of program 2 ends, the column decoder connection switch 622 and the bank connection switch 127 are opened, and thus the connection switches return to the initial state.

At a timing T711, the program transfer command generator 135 issues an activation command to the bank 102 to activate page 2 of the bank 102. The program transfer command generator 135 issues an activation command to the bank 104 to activate page 1 of the bank 104 at a timing T712, and also closes the column decoder connection switch 623 at a predetermined timing to cause the bank 104 to function as a transfer destination. Furthermore, the bank connection switches 127 and 128 are closed to connect the banks 102 and 104.

At a timing T713 at which data is read out to the sense amplifier 111 and a sense amplifier 108, the program transfer command generator 135 issues a program transfer command, and starts to transfer, via the external data bus, program 1 read out to the sense amplifier 111.

At a timing T714 at which transfer of program 1 ends, the column decoder connection switches 626 and 623 and the bank connection switches 127 and 128 are opened, and thus the connection switches return to the initial state.

At a timing T715 at which transfer of the programs from the program storage region of the bank 102 to the banks 103 and 104 is completed, a program transfer completion notifying unit notifies the reset controller 139 of program transfer completion. The column decoder connection switches 622, 623, 624, and 625 are closed. Also, the external data bus connection switches 631, 632, 633, and 634 are closed.

At a timing T716, the reset controller 139 sends a reset-release signal to the CPU 138. As a result, the electronic apparatus 600 is activated by the boot program, thereby starting the operation.

With this arrangement, the bank 102 is not accessed from the outside of the non-volatile memory 601, and transfer is performed between different banks in the non-volatile memory 601, thereby protecting the programs including the original boot program.

Furthermore, since the program is transferred in the non-volatile memory 601 without accessing the memory from the CPU 138 or using DMA (not shown) via the external bus of the non-volatile memory 601, it is possible to shorten the activation time of the electronic apparatus 600.

Fourth Embodiment

Figure 8:
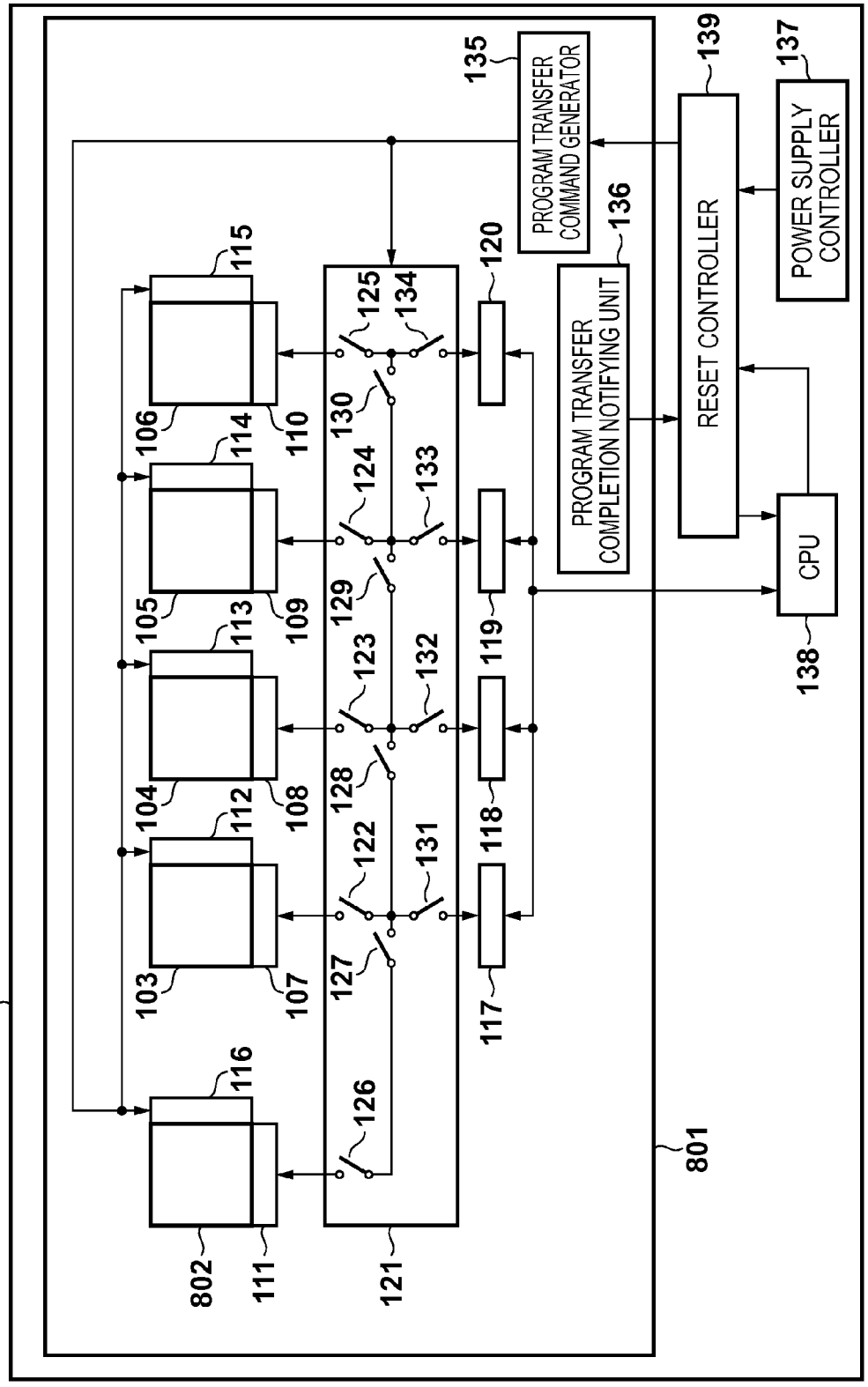
FIG. 8 is a circuit diagram showing the arrangement of an electronic apparatus according to the fourth embodiment of the present invention.
Figure 9:
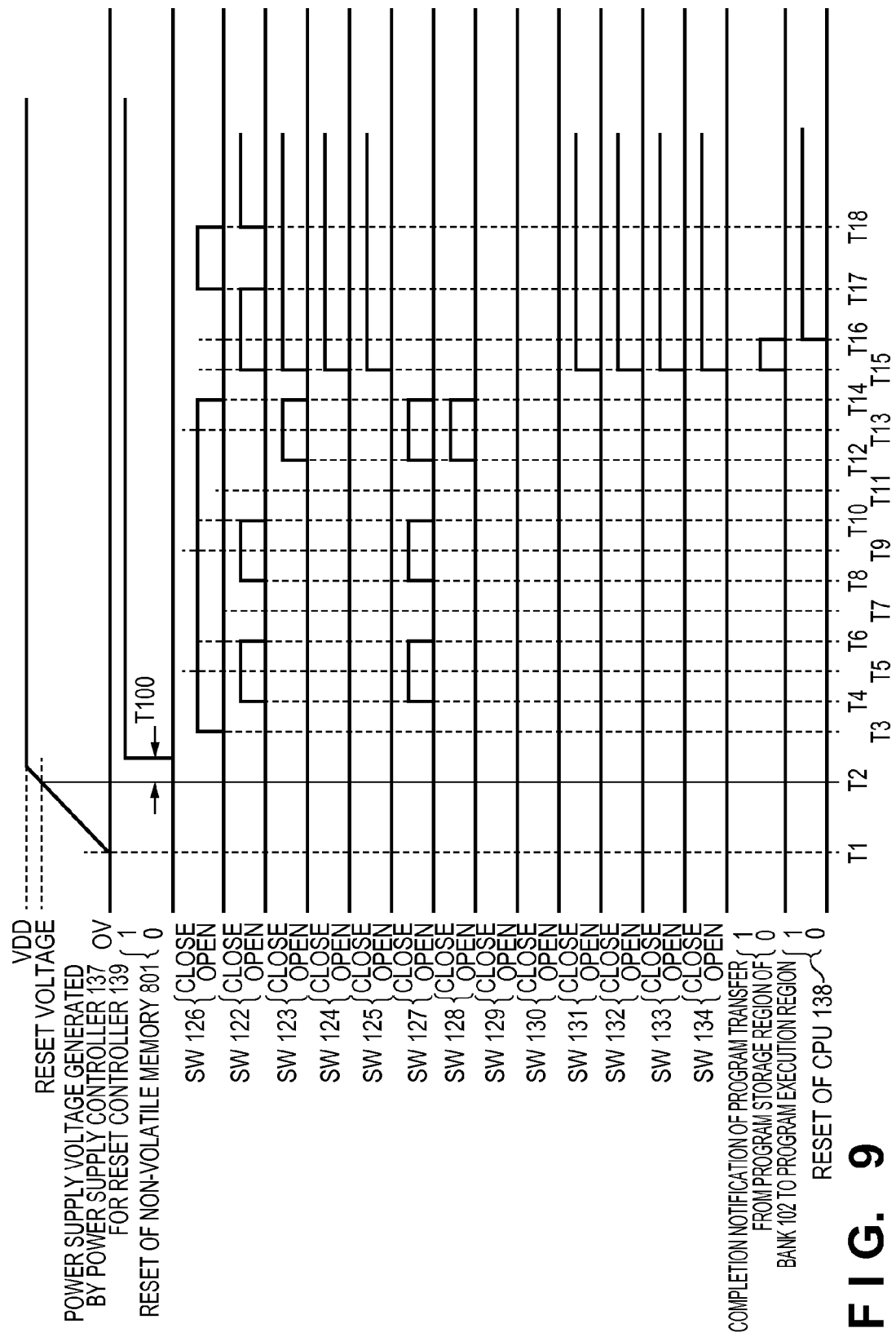
FIG. 9 is a timing chart of the electronic apparatus according to the fourth embodiment of the present invention.

The fourth embodiment will be described with reference to FIGS. 8, 9, 10, and 11. Note that the same reference symbols and numerals as those in the first embodiment denote the same components and a description thereof will be omitted. FIG. 8 is a circuit diagram showing the arrangement of an electronic apparatus according to the fourth embodiment. FIG. 9 is a timing chart according to the fourth embodiment. FIG. 10 is a flowchart of a CPU according to the fourth embodiment. FIG. 11 is a table showing the arrangement of programs according to the fourth embodiment.

Reference numeral 800 denotes an electronic apparatus according to the fourth embodiment; and 801, a non-volatile memory according to the fourth embodiment. The non-volatile memory 801 has a page size of 4 Kbytes, a bank capacity of 16 Kbytes, and a total capacity of 80 Kbytes. Programs including a boot program are stored in advance in a bank 802 of the non-volatile memory 801. The non-volatile memory 801 can perform page transfer between banks.

The bank 802 constitutes the non-volatile memory 801, and is divided into four pages, that is, page 1, page 2, page 3, and page 4. Read access or write access to this bank 802 from the outside can be made according to a command from the outside to the non-volatile memory 801. The bank 802 includes a program storage region in which the programs including the boot program are stored in advance upon shipping of the electronic apparatus 800.

The operation of the electronic apparatus 800 will be described with reference to the timing chart shown in FIG. 9. A firmware of the electronic apparatus 800 can be updated. In this embodiment, it is possible to protect the programs including the boot program and shorten the activation time of the electronic apparatus 800 by transferring the programs from the bank 802 to banks 103 and 104 in the non-volatile memory 801.

In the fourth embodiment, an example of an operation of updating a program such as firmware stored in advance in the program storage region of the bank 802 of the non-volatile memory 801 will be explained.

In the fourth embodiment, as shown in FIG. 11, in the program storage region of the bank 802, the boot program is stored in advance in page 1, a firmware update control program is stored in advance in page 2, and program 2 is stored in advance in page 3.

A program transfer command generator 135 is set to transfer, upon activation of the electronic apparatus 800, the boot program to page 1 of the bank 103, the firmware update control program to page 1 of the bank 104, and program 2 to page 2 of the bank 103.

S1000:
The user controls to power on the electronic apparatus 800, and the electronic apparatus 800 is activated during a period from a timing T1 to a timing T17, as in the first embodiment.

S1001:
A CPU 138 determines whether the firmware has been updated. This determination processing may be performed in response to an instruction from the user, or may be performed according to whether firmware at a predetermined address on a network has been updated.

S1002 (when the CPU 138 detects no update of the firmware):
The CPU 138 normally executes an application using program 2.

S1003 (when the CPU 138 detects update of the firmware):
The CPU 138 issues a bus switching command to the non-volatile memory 801.

At a timing T18 at which the non-volatile memory 801 receives the bus switching command, the state transits to a state in which access can be made from the outside of the non-volatile memory 801 to the program storage region of the bank 802 by switching a bus by closing a sense amplifier connection switch 126 and opening a sense amplifier connection switch 122.

S1004:
The CPU 138 executes the firmware update control program in page 1 of the bank 104 to activate a DMAC (not shown), thereby writing, in the program storage region of the bank 802, the updated firmware from a recording medium (not shown) in which the updated firmware is stored (or the downloaded firmware).

After that, when the updated firmware is written in the bank 802, access from the non-volatile memory 801 to the bank 802 is disabled by switching the bus again by opening the sense amplifier connection switch 126 and closing the sense amplifier connection switch 122.

With this arrangement, the program storage region of the bank 802 is not accessed from the outside of the non-volatile memory 801, and transfer is performed between different banks in the non-volatile memory 801, thereby protecting the programs including the boot program.

Furthermore, since the program is transferred in the non-volatile memory 801 without accessing the memory from the CPU 138 or using the DMAC (not shown) via the external bus of the non-volatile memory 801, it is possible to shorten the activation time of the electronic apparatus 800 whose firmware can be updated.

Although one bank is used to hold the boot program and application programs to be protected in this embodiment, two or more banks may be used. That is, it is only necessary to include a bank for storing a program to be protected and a bank for storing a program to be executed by a processor (CPU).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-241266, filed Nov. 21, 2013 which is hereby incorporated by reference herein in its entirety.

What is claimed is:

1. An electronic apparatus comprising:
a CPU configured to execute a program;
a non-volatile memory storing in advance the program to be executed by said CPU and used as a main memory region for said CPU; and
a reset unit configured to control reset of said CPU, and output, when said electronic apparatus enters a predetermined state, a predetermined signal to said non-volatile memory,
wherein said non-volatile memory includes a plurality of memory regions including a first memory region storing the program in advance and a second memory region accessed by said CPU to execute the program, a transfer unit configured to transfer the program from said first memory region to said second memory region in response to the predetermined signal from said reset unit, and a controller configured to, upon completion of transfer of the program by said transfer unit, control to disable access from the outside of said non-volatile memory to said first memory region and enable access from the outside of said non-volatile memory to said second memory region, and
upon completion of transfer of the program by said transfer unit, said reset unit outputs a reset-release signal to said CPU.

2. An apparatus according to claim 1, wherein said non-volatile memory further includes a notifying unit configured to notify said reset unit of completion of transfer of the program by said transfer unit.

3. An apparatus according to claim 1, wherein
said first memory region stores a boot program for said CPU, and
said CPU accesses said second memory region in response to the reset-release signal, and executes a boot operation according to the boot program stored in said second memory region.

4. An apparatus according to claim 1, wherein said transfer unit transfers the program based on information that is stored in an unrewritable memory element and indicates a transfer destination of the program stored in said first memory region.

5. An apparatus according to claim 1, wherein
said first memory region stores a boot program for said CPU and a first program different from the boot program, and
upon completion of transfer of the boot program and transfer of the first program, said reset unit outputs a reset-release signal to said CPU.

6. An apparatus according to claim 5, wherein said transfer unit transfers the first program after transferring the boot program.

7. An apparatus according to claim 1, wherein said non-volatile memory is configured as a single circuit chip.

8. An apparatus according to claim 1, wherein in response to an instruction to power on said electronic apparatus, said reset unit outputs a predetermined signal to said non-volatile memory.

* * * * *